United States Patent [19]

Yoshida

[11] 4,418,341
[45] Nov. 29, 1983

[54] NOISE DETECTION APPARATUS

[75] Inventor: Hajime Yoshida, Chofu, Japan

[73] Assignee: Hajime Industries Ltd., Tokyo, Japan

[21] Appl. No.: 218,128

[22] Filed: Dec. 19, 1980

[30] Foreign Application Priority Data

Apr. 10, 1980 [JP] Japan .................................. 55-47381

[51] Int. Cl.³ ............................................. G08B 21/00
[52] U.S. Cl. .................................... 340/635; 340/657; 340/699
[58] Field of Search ............... 340/540, 683, 679, 662, 340/657, 635, 566

[56] References Cited

U.S. PATENT DOCUMENTS

| 3,653,019 | 3/1972 | Barton et al. | 340/662 |
| 3,783,680 | 1/1974 | Mason | 340/683 |
| 4,163,227 | 7/1979 | Sawada et al. | 340/662 |

Primary Examiner—Glen R. Swann, III
Attorney, Agent, or Firm—Murray Schaffer

[57] ABSTRACT

A non-contact noise detection apparatus is provided with a detector not connected to the source of the noise for detecting the high frequency field generated by the source. A high pass filter and amplifier passes the high frequency components only of the output of the detector. A pulse generator is responsive to the output of the high pass filter to provide a pulse signal of predetermined width, and an indicator is responsive to the pulse generator.

9 Claims, 6 Drawing Figures

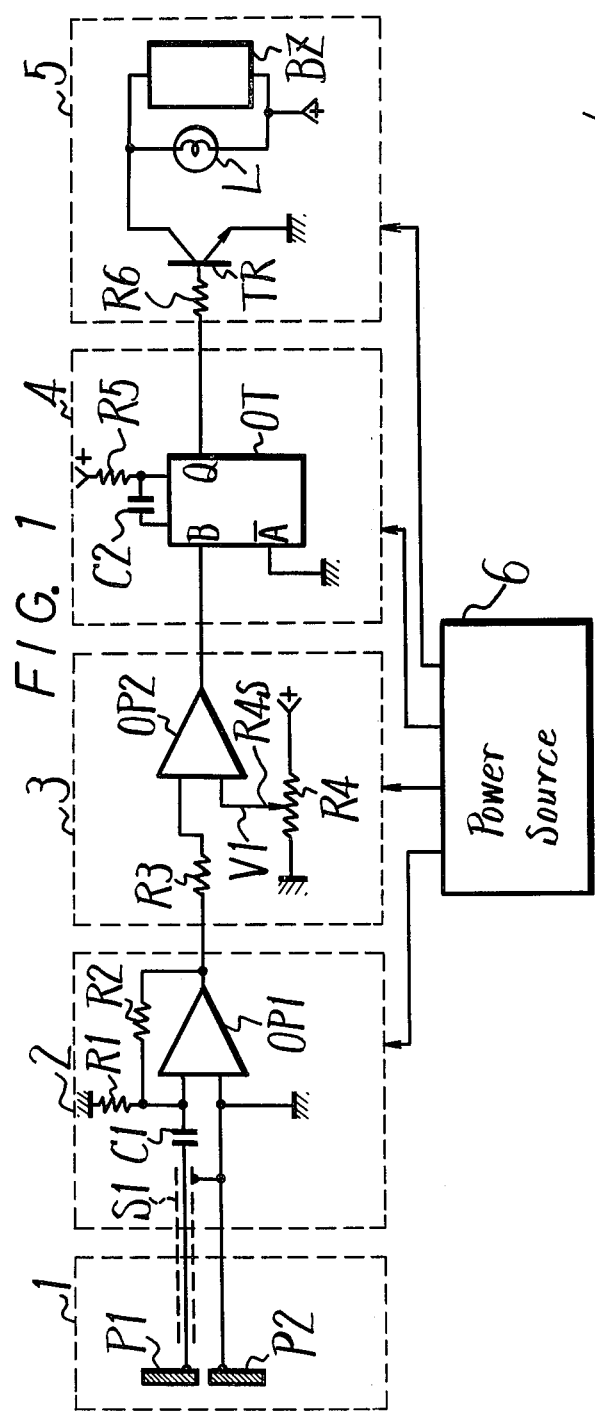
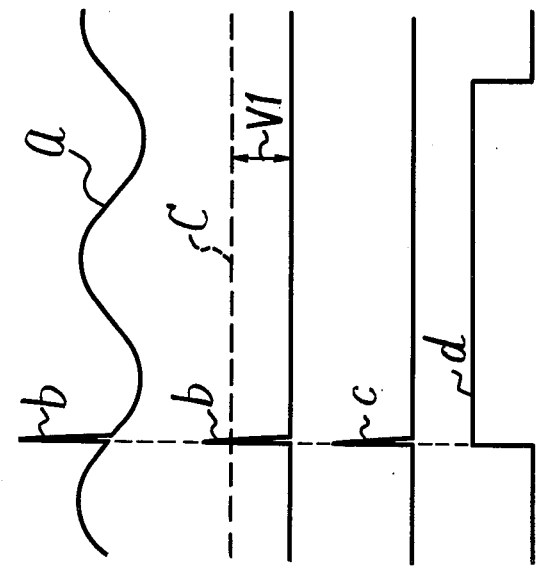
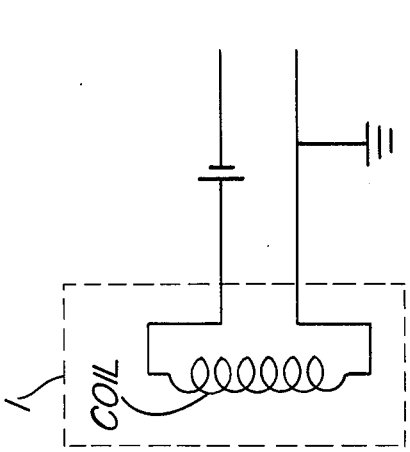
FIG. 1
FIG. 2A
FIG. 2B
FIG. 2C
FIG. 2D
FIG. 4

NOISE DETECTION APPARATUS

BACKGROUND OF THE INVENTION

1. Field of the Invention

The present invention relates to noise detection apparatus, and specifically to noise detection apparatus of the non-contact type to detect impulse noises.

2. Description of the Prior Art

The present electronic equipment development is truly remarkable particularly that which is centered about the use of ultra high integration of semiconductor elements and the utilization of logic circuitry. However, digital equipment constructed with such elements or the like are, in view of their basic construction, especially vulnerable or easily influenced by impulse noises.

Therefore, in order to secure reliability and stability in actual use of such equipment, the first requirement should be to construct the circuitry so as to be immune to a predetermined extent to impulse noises. The second requirement should be to provide impulse noise reduction means where such equipment is installed.

In order to provide such impulse noise reduction means, it is necessary to check the conditions of the noise generation. In other words, it is necessary to check the generated location, generated frequency and amplitude of such impulse noise. Checking for such purposes at present is conducted by complicated, bulky and high cost oscillographs or special noise detection equipment or the like. Such conventional equipment, must be connected by wire to the suspected source of the impulse noise generation so that a direct electrical connection to check the noise generation existence or not is required. Accordingly, with such conventional equipment, there is the inconvenience that it is entirely impossible to detect any noise leaking through the air space and through areas to which leads wires of the equipment cannot be directly connected. Furthermore, there is the intricacy that the lead wires must be directly connected to the measured spots. In addition the equipment is bulky, expensive and most impractical to carry around.

OBJECTS AND SUMMARY OF THE INVENTION

Therefore, the main object of the present invention is to provide a noise detection apparatus which resolves the defects of the above mentioned conventional equipment.

Another object of the invention is to provide a noise detection apparatus which is portable and compact.

A further object of the invention is to provide a non-contact type noise detection apparatus of light weight.

According to one aspect of the present invention, a noise detection apparatus is provided, which includes:

(a) a first means for detecting a high frequency noise field that is generated by a noise generation source in a non connected status to the above mentioned noise generation source;

(b) a second means for passing therethrough only high frequency pulse components in an output from the said first means;

(c) a third means for generating a pulse signal of a predetermined width by the output of said second means;

(d) a fourth means for indicating any noise generation on receiving the pulse signals from said third means; and (e) a power source for supplying power to said second to fourth means.

Additional, and other objects, features and advantages of the present invention will become apparent from the following description taken in conjunction with the accompanying drawings through which like references designate the same elements and parts.

BRIEF DESCRIPTION OF THE DRAWINGS

FIG. 1 is a circuit diagram illustrating one example of a noise detection apparatus according to the present invention;

FIGS. 2a, 2b and 2c illustrate wave form diagrams which are used to explain the operation of the example shown in FIG. 1;

FIG. 4 is a partial circuit diagram showing the use of high frequency coils, as the detector.

DESCRIPTION OF THE PREFERRED EMBODIMENTS

Figure 3:
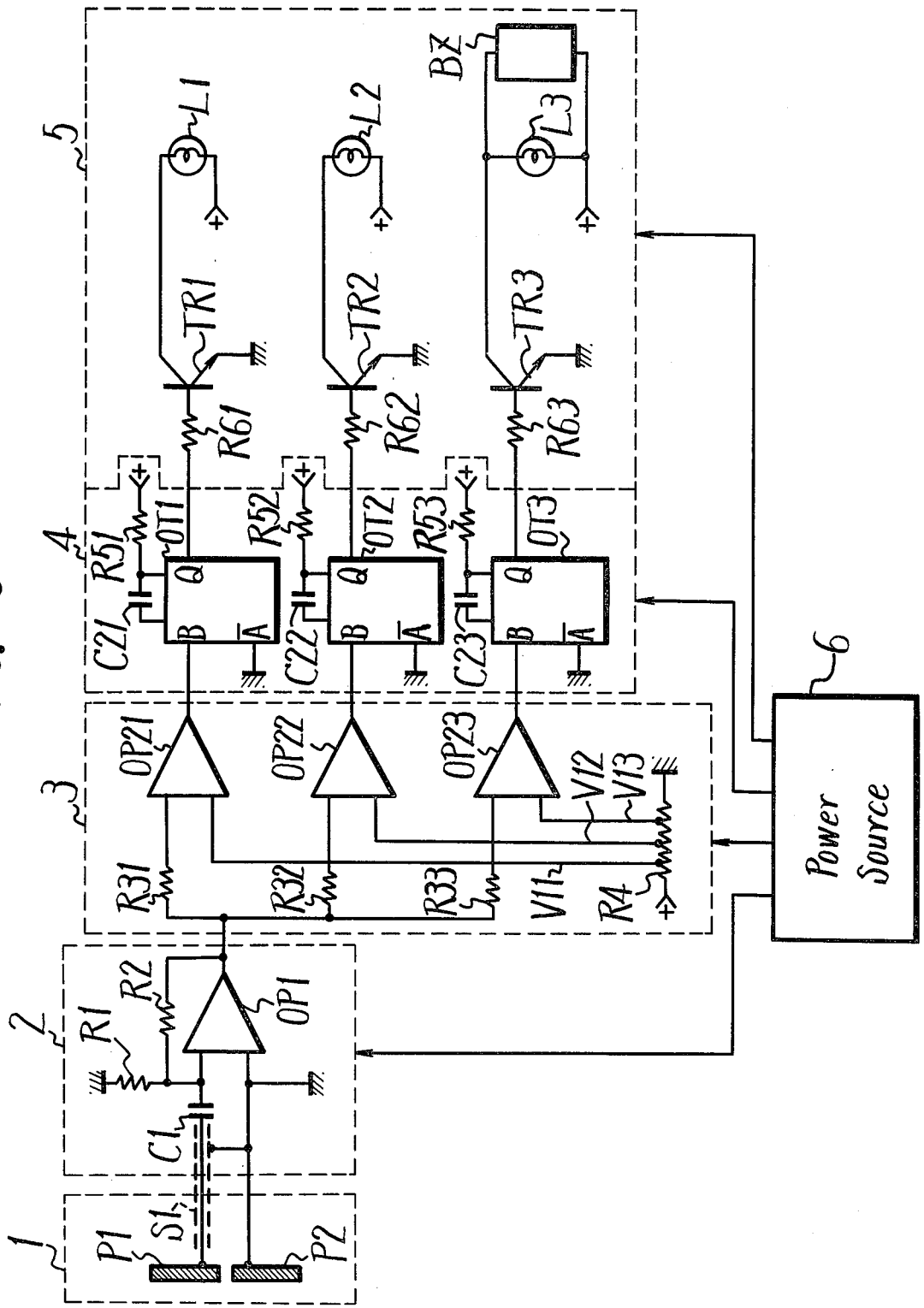
FIG. 3 is a circuit diagram illustrating another example of the present invention.

The present invention will be explained hereunder with reference to the drawings.

FIG. 1 illustrates a circuit of the noise detection apparatus according to the present invention. On FIG. 1, 1 is a detection section which consists of poles or electrodes P1 and P2, for detecting an impulse noise or the like. The detection section 1 detects high frequency pulsated space fields, especially the potential due to an impulse noise or the like and produces an output signal corresponding to the impulse noise. Such output signal is supplied to a high pass filter and amplifier section 2. Upon such supply, with a purpose to prevent the mixture from any unnecessary potential other than that from poles P1 and P2, the lead wire connecting the detection section 1 to the high pass filter and amplifier section 2 is shielded as at S1. The high filter and amplifier section 2 comprises a capacitor C1, resistors R1 and R2 and an OpAmp (operational amplifier) OP1. Now, by the selection of a time constant as set by capacitor C1 and resistor R1, only the high frequency components among the output of the detection section 1 are supplied to the OpAmp OP1. At the OpAmp OP1, the input signals are amplified at the amplification factor set by resistor R2 and then fed to the next stage, a level selector section 3. At the level selector section 3, a level comparator OP2 is contained. To one input terminal of the same, the output from OpAmp OP1 is supplied via resistor R3, and the other input terminal of the same is connected to the sweeper or movable piece R4S of variable resistor R4. Accordingly, the amplitude of the output signal from the level comparator OP2 is determined by a standard or threshold potential V1 appearing at the sweeper R4S. The output of the level selector section 3, in other words, the output of level comparator OP2 is supplied to a pulse width extender section 4. This pulse width extender section 4 mainly contains a one shot timer OT, which by the time factor as set by capacitor C2 and resistor R5, extends the supplied pulse signal band width to a certain set value width. The reason is that the pulse width of the impulse noise to be detected is normally around such unit values from nano seconds to micro seconds and accordingly it is practically impossible for a human being to confirm an alarm even though an alarm such as a lamp is driven by detecting such impulses and by driving the alarm with such corresponding signal alone. In other words, in order for the human being to recognize the irradiation of a lamp or the like, the irradiation must continue at least in the milisecond order and for a distinct recognition it is desirous that such lamp irradiation continues between 1/10 to ½ second. For this reason, the pulse width extender section 4 is provided. The extended pulse width as the output of pulse width extender section 4 is supplied to an alarm section 5, which mainly contains lamp L, buzzer Bz and such driving transistor TR. Now, the output from the pulse width extender section 4 is supplied to the base of the transistor TR via resistor R6. Lamp L and buzzer Bz are both connected in parallel and connected in series to the collector-emitter path of transistor TR. Incidentally, 6 in FIG. 1 is a power source such as a battery, for the sections 2, 3, 4 and 5 on FIG. 1.

The operation of the example of the present invention as illustrated on FIG. 1 will be explained in reference with FIG. 2.

It can be assumed that at the proposed impulse noise measurement place, an impulse b which is a noise, is superimposed on an AC wave a at the AC line. By bringing the detection section 1 close to the place, the poles P1 and P2 will pick up both as a space potential. By supplying such output to the high pass filter and amplifier section 2, the low frequency AC wave a is removed leaving only the impulse b so that the output wave from the high pass filter and amplifier section 2 appears as shown as in FIG. 2B. The output wave in FIG. 2B is supplied to the next stage which is the level selector section 3. By setting the potential as level C on FIG. 2B for instance, by adjusting variable resistor R4 as a threshold value V1, and because impulse b level (amplitude) as shown on the same drawing exceeds level C, the output of level selection section 3 accordingly appears as wave c as shown on FIG. 2C. The time width of this output signal c, which in other words is the impulse width, is extremely short as aforementioned so that even if it is converted into light or sound, the human being will not be able to recognize the same. Therefore, in this example of the present invention, the output signal c from the level selector section 3 is supplied to the pulse width extender section 4. Then, at the pulse width extender section 4, the input time width of signal c is converted and output as signal d which has a width suitable for recognition by human being when converted into light or sound. This is shown as FIG. 2D. Such signal d is supplied to the alarm section 5 so that the transistor TR is conducted during the high level of signal d by which the power from power source 6 flows to the lamp L or buzzer Bz through transistor TR and while the transistor TR remains conducted, in other words for a period of time that the human being can recognize, lamp L is lighted or buzzer Bz generates a sound so that the operator realizes the impulse noise generation at the measuring place.

As above described, according to the present invention, by merely bringing the detection section 1 of the noise detection apparatus close to the inspected or measured place and without making direct connections thereto, in other words, the existence or not of noise such as impulses may be measured without contact. Further, the construction of the detection apparatus of this invention is simple, and dimensions can be made small. In addition, batteries suffice as the power source 6. Thus the detectionapparatus can be made in compact size such as pocket radios in current use, rendering it conveniently portable for practical use. In other words, there is the great advantage that the generation source of noise such as impulse at any location can by non-contact, easily and surely be detected.

Now, on the exampl of the present invention illustrated on FIG. 1, the standard or threshold value V1 is set by the adjustment of the variable resistor R4 at the level selector section 3, but other means may be considered. FIG. 3 illustrates another example of the invention. In this example, the level selector section 3 has a plurality of level comparators, which in this example has 3 level comparators OP21, OP22, OP23 and while one input terminal of each of them is connected to the output terminal of OpAmp OP1 through respective resistors R31, R32, R33, the other input terminals are fed with separate standard or threshold values V1, V2, V3 respectively as set by the common variable resistor R4 for each comparator. On the other hand, at the pulse width extender section 4, a corresponding number of sections to the numbber of the level comparators are installed, which in this example is 3, in other words, respective one shot timers OT1, OT2, OT3 each having a comparator C21-C23 and resistor R51-R53 respectively are set in similar relation as the example in FIG. 1. In the same respect, the alarm section 5 should be in pulural, in this case 3 each so that the output side of one shot timers OT1, OT2, OT3 are connected to the lamps L1, L2, L3 respectively through resistors R61=R63 and transistors TR. According to the example of the invention illustrated on FIG. 3, not mentioning only the existence or not of noises such as impulses, the large or small of such amplitudes may be measured at the same time. In other words, by setting separate standard levels V11, V12 and V13, the lamps L1, L2 and L3 may be lighted depending upon the amplitude of small medium or large, as 1 only or 2 each at the same time or all 3 at the same time. Further, as shown on FIG. 3, if the buzzer Bz is connected in parallel with lamp L3 corresponding to the smallest amplitude of the impulse, the buzzer will generate an alarm sound at all instances of noise detection.

It is noted that poles were used as the detection section 1 in the above mentioned examples of the present invention, it is apparent that the same results may be obtained by using high frequency coils as a substitute as seen in FIG. 4. Further, while both buzzers and lamp are installed at the alarm section, either on may be eliminated, or a further meter may be added to indicate the amplitude of small or large of the measured impulses.

I claim as my invention:

1. A noise detection apparatus comprising:
   (a) a first means for detecting a high frequency pulse field as generated from a noise generation source without being connected to such noise generation source;
   (b) a second means for passing therethrough high frequency pulse components of an output from said first means;
   (c) a third means for producing a pulse signal with a predtermined width responsive to an output from said second means;
   (d) a fourth means for indicating generation of noise on receiving the pulse signal from said third means; and
   (e) a power source for supplying power to said second to fourth means.

2. A noise detection apparatus as claimed in claim 1, in which said first means consists of a pair of electrodes.

3. A noise detection apparatus as claimed in claim 1, in which said first means is a high frequency coil.

4. A noise detection apparatus as claimed in claim 1, in which said power source is a battery.

5. A noise detection apparatus as claimed in claim 1, in which said fourth means includes a buzzer and/or a lamp.

6. A noise detection apparatus according to claim 1 further comprising a level selection means which receives the output from said second means and delivers a signal component with a level higher than a predetermined level to said third means.

7. A noise detection apparatus as claimed in claim 6, in which said level selection means consists of a level comparator and a variable resistor, said variable resistor changing a threshold value to set said predetermined value.

8. A noise detection apparatus as claimed in claim 7, in which said level selection means includes a plurality of sets of a level comparator and a variable resistor to set a plurality of different predetermined levels.

9. A noise detection apparatus as claimed in claim 8, in which said fourth means includes a plurality of lamps in correspondence with said plurality of sets of a level comparator and a variable registor.

* * * * *